United States Patent [19]
Priebe

[11] Patent Number: 5,610,573
[45] Date of Patent: Mar. 11, 1997

[54] METHOD AND APPARATUS FOR DETECTING ASSERTION OF MULTIPLE SIGNALS

[75] Inventor: Gordon W. Priebe, Maple Grove, Minn.

[73] Assignee: LSI Logic Corporation, Milpitas, Calif.

[21] Appl. No.: 527,660

[22] Filed: Sep. 13, 1995

[51] Int. Cl.$^6$ .................................................. G06F 7/02
[52] U.S. Cl. ........................................................ 340/146.2
[58] Field of Search ............................ 340/146.2; 327/53

[56] References Cited

U.S. PATENT DOCUMENTS

| | | | |
|---|---|---|---|
| 4,040,016 | 8/1977 | Lee et al. | 340/173 CA |
| 4,634,900 | 1/1987 | Koshizuka | 307/530 |
| 4,641,283 | 2/1987 | Wilhelm | 365/190 |
| 4,825,110 | 4/1989 | Yamaguchi et al. | 307/530 |
| 4,964,083 | 10/1990 | Nogle et al. | 365/189.11 |
| 4,991,141 | 2/1991 | Tran | 365/207 |
| 5,268,874 | 12/1993 | Yamauchi | 365/233.5 |
| 5,345,419 | 9/1994 | Fenstermaker et al. | 365/189.04 |
| 5,414,662 | 5/1995 | Foss et al. | 365/203 |

FOREIGN PATENT DOCUMENTS

| | | | |
|---|---|---|---|
| 0147842 | 7/1985 | European Pat. Off. | 340/146.2 |
| 01-248397 | 10/1989 | Japan . | |

Primary Examiner—Margaret Rose Wambach
Attorney, Agent, or Firm—Katz & Cotton, LLP

[57] ABSTRACT

A multiple match detection circuit including an array of N and P-channel pull-up and pull-down devices receiving a corresponding array of hit line signals for developing complementary bit line signals, which are provided to the respective inputs of a differential amplifier. Respective buffers drive the bit line signals to a maximum voltage differential in normal mode. For each hit line asserted, the pull-up and pull-down devices modify the voltage of the corresponding bit line by an incremental amount, thereby decreasing the bit line differential. The differential amplifier switches to indicate an error when the polarity of the differential voltage between the bit lines is reversed relative to the normal state. Any given single hit line does not cause enough of a voltage change to reverse the polarity of the differential voltage of the bit lines. However, if more than one hit line is asserted, then both bit lines are dominated by the activated complementary pull-up and pull-down devices, respectively, causing the bit line differential voltage to reverse polarity. In effect, the combined incremental change of voltage due to activation of two or more pull-up and pull-down devices is greater than the maximum voltage differential between the bit line signals asserted by the buffers. The differential error amplifier detects the reversal of polarity of the bit line differential voltage and asserts an error signal.

17 Claims, 3 Drawing Sheets

METHOD AND APPARATUS FOR DETECTING ASSERTION OF MULTIPLE SIGNALS

BACKGROUND OF THE INVENTION

1. Technical Field of the Invention

The present invention relates to multiple signal match detection, and more particularly to a method and apparatus for detecting two or more signals asserted at the same time for indicating an error condition.

2. Description of the Related Art

It is desired to detect the assertion of two or more signals at the same time, such as two or more word or hit line signals of a memory system. For example, a plurality of word or hit lines are typically used to access individual memory cells, where only one hit line should be asserted at any given time to assure that the correct data is read or written. If an error condition exists where two or more hit lines are asserted, it is desired to detect and report the error condition in order to invalidate data written or otherwise retrieved.

In a circuit according to prior art, a plurality of N-channel metal-oxide semiconductor field-effect transistors (MOSFETs) have their drains connected to a common node, where the common node is pulled high through a pull-up resistor. The sources of the MOSFETs are connected to ground and their gates receive respective hit line signals. An inverter having its input connected to the common node asserts an error signal whenever the common node is pulled low. Normally, all of the hit lines are deasserted low, so that the common node is normally pulled high through the pull-up resistor. When any one hit line is asserted, the corresponding MOSFET is activated thereby providing a resistive current path to ground. This resistive current path divides the overall voltage with the pull-up resistor to reduce the voltage of the common node. However, a single N-channel MOSFET is not intended to be able to pull the voltage of the common node low enough to switch the inverter. However, if a second hit line is asserted activating another MOSFET, the combined parallel resistance of the two or more MOSFETs is supposed to pull the common node to a low enough voltage to switch the inverter, thereby asserting the error signal.

The prior art circuit described above is easily implemented, but is relatively unreliable over all voltage, temperature and process combinations. In particular, such voltage, temperature and process variations affect all components, including the pull-up resistor, the MOSFETs and the inverter, thereby changing the switch point of the circuit. The unreliability occurs because voltage, temperature, and/or process variations cause a large range for the switch point, rendering operation unpredictable over all operating conditions. In particular, such variations often cause the circuit to fail to detect multiple hit lines being asserted, or to indicate an error condition with the assertion of only one hit line.

It is desired to provide a reliable, multiple match detection circuit which is reliable over variations of voltage, temperature and process variations. Such a circuit could be used to increase the reliability of memory devices, such as a translation look-aside buffer (TLB). Such error detection would simplify the development of an operating system and memory management hardware for very efficient and fast detection of erroneous data.

SUMMARY OF THE INVENTION

A multiple match detection circuit according to the present invention includes an array of pull-up and pull-down devices receiving corresponding hit line signals for developing complementary bit line signals, which are provided to the respective inputs of a differential amplifier. Respective buffers drive the bit lines to opposite ends of a maximum voltage range in normal mode. For each hit line asserted, corresponding pull-up and pull-down devices modify the voltage of both bit lines by an incremental amount to decrease the voltage differential between the bit lines. The differential amplifier switches to detect an error when the polarity of the differential voltage between the bit lines is reversed relative to the normal state.

Any given single hit line does not cause enough of a voltage change to reverse the polarity of the differential voltage of the bit lines. However, if two or more hit line signals are asserted, then both bit lines are dominated by the complementary array of pull-up and pull-down devices, respectively, causing the bit line differential voltage to reverse polarity. In effect, the combined incremental change of voltage due to activation of two or more pull-up and pull-down devices is greater than the maximum voltage range of each bit line signal. The differential error amplifier detects the reversal of polarity of the bit line differential voltage and asserts the error signal.

In the preferred embodiment of the present invention, each hit line signal is provided to a corresponding gate of an array of N-channel MOSFETs, having their drains connected to a common negative bit line and their sources connected to ground. The bit line signals are also provided to an array of inverters, having their outputs connected to the gates of a plurality of P-channel MOSFETs, each having their drains connected to a positive bit line and their sources pulled high to the supply voltage. In a default state, a timing signal is deasserted low, and is provided to an inverter buffer for driving the positive bit line high and is also provided through a buffer to pull the negative bit line low. When the timing signal is asserted high, the inverter buffers attempt to drive the positive bit line all the way low and the negative bit line all the way high.

If any one of the hit line signals is asserted, the corresponding N-channel device pulls the negative bit line low by an incremental amount, and the corresponding P-channel device pulls the positive bit line high by an incremental amount, thereby decreasing the voltage differential between the bit lines. Nonetheless, the differential polarity is not changed, so that the differential comparator still deasserts the error signal low. However, if two or more of the bit signals are asserted when the timing signal is asserted, the N and P-channel devices cause the voltage differential between the negative and positive bit line signals to reverse polarity. The differential comparator correspondingly switches to indicate an error. Therefore, the differential comparator determines the differential voltage of the positive and negative bit lines for determining if two or more hit line signals are asserted at the same time.

The differential comparator preferably provides a single ended output of the complementary bit lines and tracks the behavior of the array of complementary pull-up and pull-down devices for providing robust operation in spite of variations in voltage, temperature and the manufacturing process. In particular, the P and N-channel devices are distributed so that variations affecting all of the P or N-channel devices tend to be minimized. In this manner, a multiple match detection circuit according to the present invention is very reliable over all operating parameter variations. The present invention is preferably implemented using complementary MOS (CMOS) technology. The advantage over the present invention is that the appropriate detection condition is correct over all operating parameter variations, including voltage, temperature and/or process variations.

BRIEF DESCRIPTION OF THE DRAWINGS

A better understanding of the present invention can be obtained when the following detailed description of the preferred embodiment is considered in conjunction with the following drawings, in which.

DETAILED DESCRIPTION OF THE PREFERRED EMBODIMENT

Figure 1:
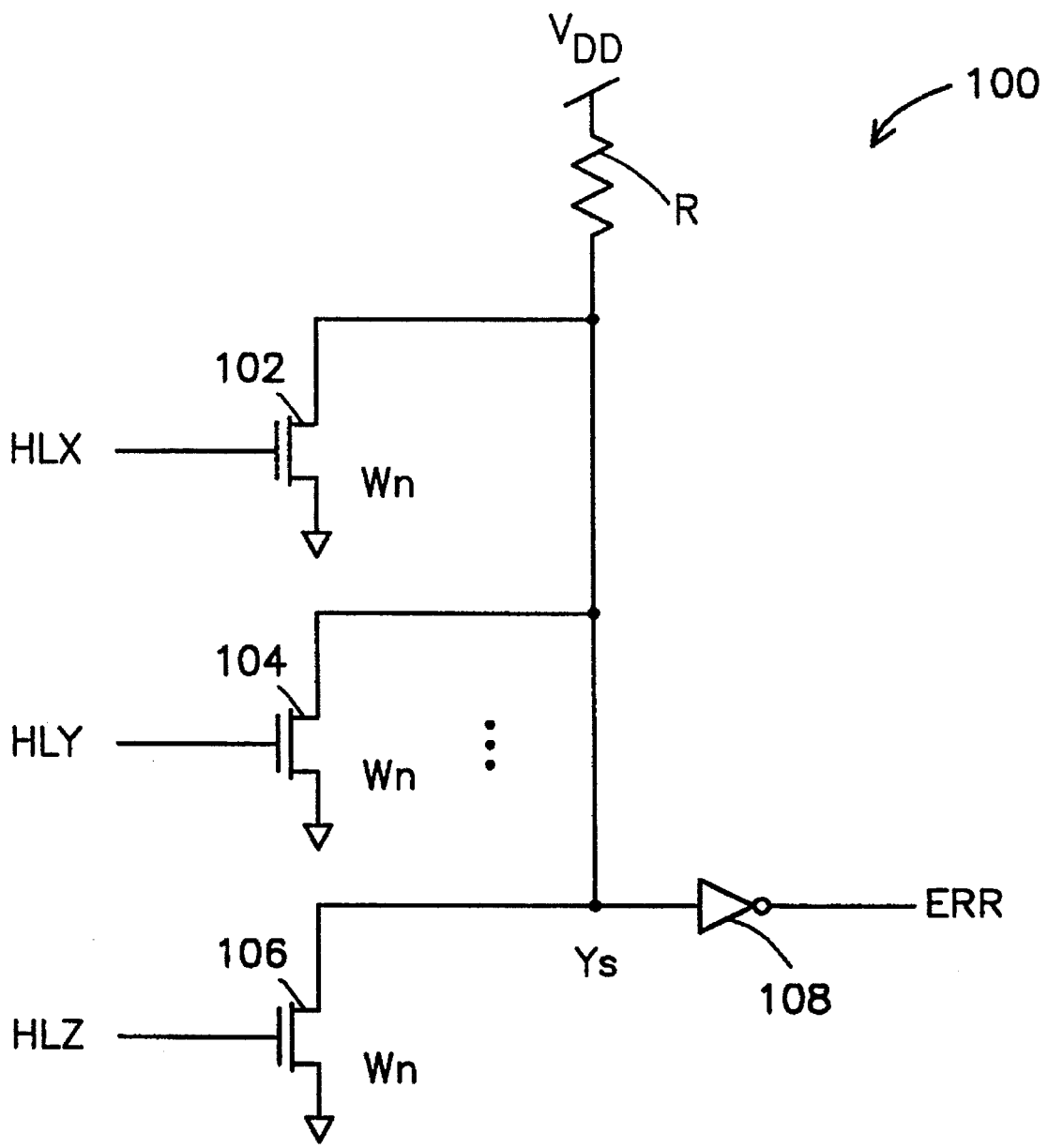
FIG. 1 is a simplified schematic diagram of a multiple match detect circuit according to prior art.

Referring now to FIG. 1, a simplified schematic diagram is shown of a multiple match detection circuit 100 according to prior art. A plurality of hit line signals HLX, HLY, . . . HLZ are provided to the gate inputs of a corresponding plurality of N-channel metal-oxide semiconductor field-effect transistors (MOSFETs) 102, 104, . . . 106, each having their sources connected to ground and their drains connected together to a common node $Y_s$. The $Y_s$ node is also connected to one end of a pull-up resistor R. The other end of the resistor R is connected to power supply VDD. The $Y_s$ node is also connected to the input of an inverter 108, which asserts an error signal ERR at its output. Although only three hit line signals HLX, HLY and HLZ are illustrated for purposes of clarity, it is understood that the number of hit lines could be much larger, such as for example 32, 64, 128, etc.

Operation of the multiple detection circuit 100 is now described. In a default condition, the HLX, HLY and HLZ hit line signals are all deasserted low, so that the corresponding MOSFETs 102, 104 and 106 are turned off The $Y_s$ signal is pulled high through the pull-up resistor R to VDD so that the ERR signal is deasserted low. The assertion of any one of the hit line signals, such as the HLX signal, causes the corresponding MOSFET 102 to be activated. The path between the drain and source of each of the MOSFETs 102, 104 and 106 is a high impedance path when deactivated and is a resistive path when activated, thereby dividing the VDD voltage between the resistor R and the drain to source resistance of the activated MOSFET.

It is intended that the resistance of each one of the MOSFETs 102, 104 and 106 is high enough and that the switch point of the inverter 108 is low enough, so that the $Y_s$ signal does not switch the inverter 108 any time only one of the hit line signals is asserted high. In this manner, when any one of the hit line signals HLX, HLY or HLZ is asserted and the remaining hit line signals are deasserted, then the $Y_s$ signal is above the threshold of the inverter 108 so that it still asserts the ERR signal low. The effective resistance of the MOSFETs 102, 104 and 106 and the switch point of the inverter 108 are intended to be such that when any two or more of the MOSFETs 102, 104 or 106 are turned on, the $Y_s$ signal is pulled low enough to toggle the inverter 108, which correspondingly asserts the ERR signal high.

Although, the intended operation of the multiple match detection circuit 100 is to assert the ERR signal whenever two or more hit line signals are asserted, experience has shown that the multiple detection circuit 100 is unreliable over the total spectrum of operating parameter variations. For example, voltage variations of the VDD will cause shifting of the voltage at the $Y_s$ node. Temperature changes also affect the values of the resistor R, and the switching point and effective resistances of the MOSFETs 102, 104 and 106. In addition, the operating characteristics, i.e., switching point of the inverter 108 could also be affected. Thus the possible variations in the $Y_s$ signal and switching point of the inverter 108 may cause malfunction of the multiple match detection circuit 100. When there are multiple variations of two or more of these parameters, there may be a significant increase the probability of malfunction. Thus proper operation cannot be guaranteed. Such process variations are likely to occur for the MOSFETs 102, 104 and 106, which are otherwise assumed to be substantially the same.

In summary, the multiple match detection circuit 100 shown in FIG. 1 is unreliable over all voltage, temperature and process ranges and combinations thereof. Combinations of variations in voltage, temperature and/or the manufacturing process often cause false tripping of the circuit even if only one hit line signal is asserted, or multiple match conditions may go undetected.

Figure 2:
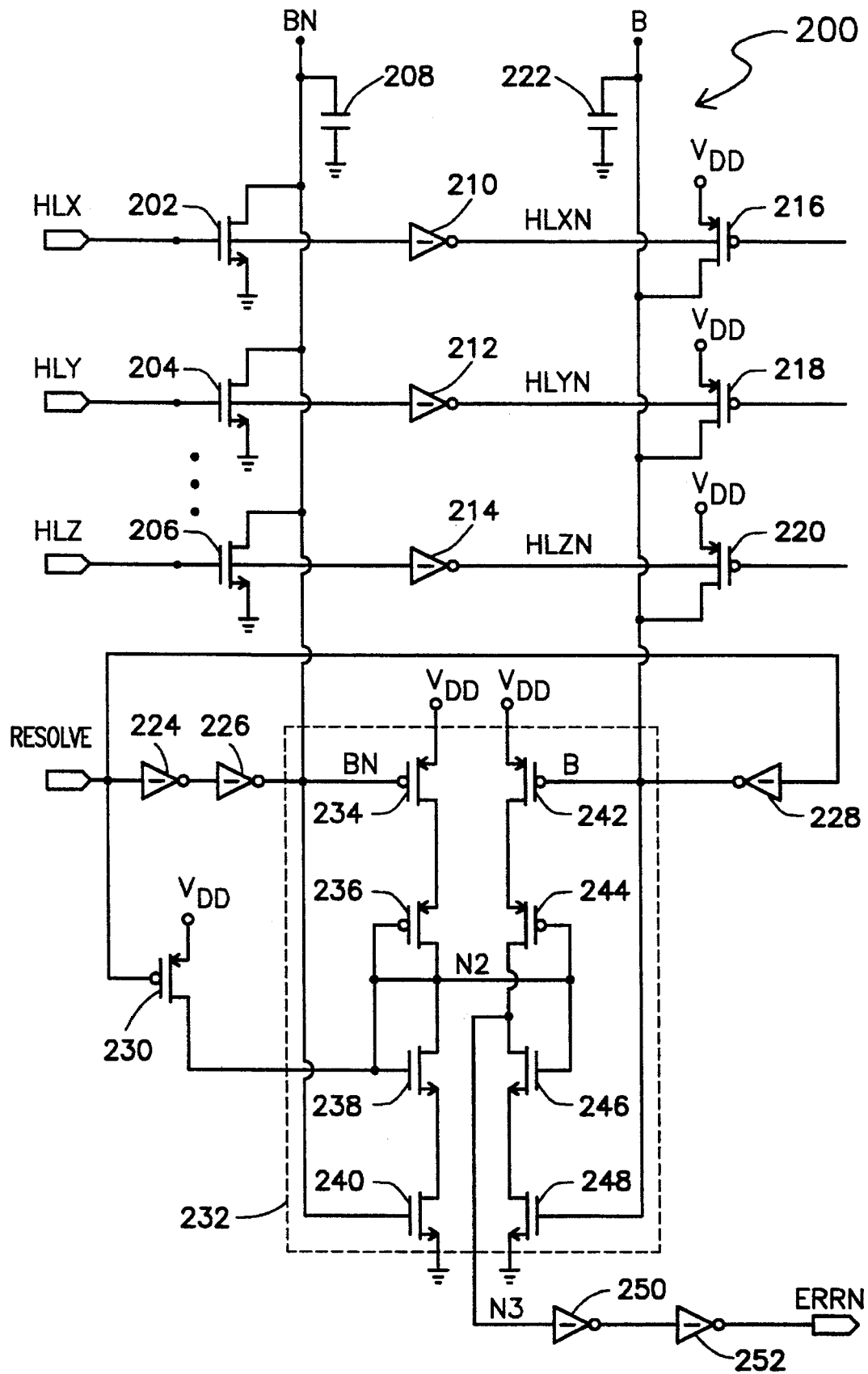
FIG. 2 is a schematic diagram of a multiple match detection circuit according to the present invention.

Referring now to FIG. 2, a schematic diagram is shown of a multiple match detection circuit 200 implemented according to the present invention. Three hit line signals HLX, HLY and HLZ are shown, it being understood that any number of hit line signals, such as 32, 64, 128, etc., could be provided to the multiple match detection circuit 200. The HLX, HLY and HLZ signals are provided to the gates of N-channel MOSFETs 202, 204 and 206, respectively, each having their sources connected to ground and their drains connected together to a common negative bit line signal, referred to as BN. The BN signal is filtered through a capacitor 208 to ground. The hit line signals HLX, HLY and HLZ are also provided to the inputs of inverters 210, 212 and 214, respectively, having their outputs providing corresponding inverted hit line signals HLXN, HLYN and HLZN. The inverted hit line signals HLXN, HLYN and HLZN are provided to the gates of P-channel MOSFETs 216, 218 and 220, respectively. The P-channel MOSFETs 216, 218 and 220 have their drains connected together and to a positive bit line signal, referred to as B, which is filtered through a capacitor 222 to ground. The sources of the MOSFETs 216, 218 and 220 are all pulled high to a source voltage referred to as VDD.

A timing signal referred to as RESOLVE is provided to the respective inputs of two inverter buffers 224 and 228. The output of inverter 224 is provided to the input of another inverter buffer 226, having its output connected to the BN signal. The output of the inverter 228 asserts the B signal. Of course, a single, non-inverting buffer could replace the dual series inverters 224, 226. The RESOLVE signal is deasserted low in a default state to drive the B, BN signals high and low, respectively. When the RESOLVE signal is asserted high, the B, BN signals are asserted low and high, respectively, assuming none of the MOSFETs 202, 204, 206, etc. and 216, 218, 220, etc. are activated. The inverters 226, 228 assert the BN, B signals, respectively, approximately between the same maximum voltage range, which is substantially between 0 and 3.2 volts in the embodiment shown.

The RESOLVE signal is also provided to the gate of a P-channel MOSFET 230, having its source connected to VDD and its drain asserting a signal N2 to the gates of two P-channel MOSFETs 236, 244 and to the gates of two N-channel MOSFETs 238, 246. The drains of the MOSFETs 236, 238 are connected together and to the N2 node. Also, the drains of the MOSFETs 244, 246 are connected together for asserting a signal N3. The BN signal is provided to the gate of a P-channel MOSFET 234 and to the gate of an N-channel MOSFET 240. The source of the P-channel MOSFET 234 is connected to VDD and its drain is connected to the source of the MOSFET 236. The source of the N-channel MOSFET 238 is connected to the drain of the MOSFET 240, which has its source connected to ground. The source of the P-channel MOSFET 242 is connected to VDD and its drain is connected to the source of the MOSFET 244. The source of N-channel MOSFET 246 is connected to the drain of the N-channel MOSFET 248, which has its source connected to ground. The N3 signal is provided to the input of an inverter 250, having its output connected to the input of another inverter 252, which asserts an inverted error signal ERRN at its output.

The bit line signals B, BN form a complementary bit line scheme. When the RESOLVE signal is asserted, the inverters 226, 228 normally drive the BN, B signals to the maximum voltage differential of approximately 3.2 volts as mentioned above. Each of the P-channel MOSFETs 216, 218, 220 act as pull-up devices when asserted for pulling the voltage of the B signal higher by an incremental amount to counteract the output of the inverter 228 when the RESOLVE signal is asserted. In a similar manner, the N-channel MOSFETs 202, 204, 206 act as pull-down devices when asserted for pulling the voltage of the BN signal low by an incremental amount to counteract the output of the inverter 226 when the RESOLVE signal is asserted. These incremental changes reduced the differential voltage between the B, BN signals. The incremental voltage added by the complementary N and P-channel MOSFETs need not necessarily be the same. However, the combined incremental voltage added to the respective bit line signals B, BN by each pair of corresponding P and N-channel devices activated alone is less than the maximum voltage differential of the bit line signals B, BN. Further, the combined incremental voltage added to the respective bit line signals B, BN by any two or more pairs of corresponding P and N-channel devices, activated together, is greater than the maximum voltage differential of the bit line signals B, BN.

The N and P-channel MOSFETs 234, 236, 238, 240, 242, 244, 246 and 248 form a differential comparator 232 for asserting the N3 signal high or low based on the voltage differential of the B and BN signals when the MOSFET 230 is turned off In general, the differential comparator 232 asserts the N3 signal, and thus the ERRN signal, high when the voltage difference between the B and BN signals, or B–BN, is negative. The differential comparator 232 asserts the N3 and ERRN signals low, indicated an error condition, when the voltage difference B–BN is positive. The differential comparator 232 need not be very sensitive to a differential voltage since the inverters 226, 228, the MOSFETs 202, 204, 206 and the MOSFETs 216, 218, 220 assure relatively wide voltage differentials between the B and BN signals. However, the differential comparator 232 should be implemented to have a fairly wide common mode range since the voltage differential between B and BN signals may be as high as 3.2 volts or as low as 400 mV in the embodiment shown. The particular differential comparator 232 shown is exemplary only, as any comparable differential comparator with adequate voltage sensitivity and relatively wide common mode range will suffice.

When the HLX, HLY, HLZ hit line signals are deasserted low, the N-channel MOSFETs 202, 204 and 206 and the P-channel MOSFETs 216, 218 and 220 are all turned off and otherwise do not affect the bit line signals B, BN. The RESOLVE signal is deasserted low in the default state, so that the B signal is asserted high and the BN signal is asserted low. In the default state, the P-channel MOSFET 230 is turned on pulling the N2 signal high, which tuns on the N-channel MOSFET 246. The B signal activates the N-channel MOSFET 248, so that N3 and the ERRaN signals are asserted low. This is not considered an error condition, however, since the RESOLVE signal is deasserted low.

When the RESOLVE signal is asserted high, the B signal is pulled low and the BN signal is asserted high assuming the HLX, HLY, HLZ hit line signals are deasserted. The N2 signal temporarily stays high keeping the N-channel MOSFET 238 on even though the P-channel MOSFET 230 is tuned off When the BN signal goes high, it activates the N-channel MOSFET 240 pulling the N2 signal low. Since the B and N2 signals are both low, the P-channel MOSFETs 242, 244 are turned on pulling the N3 and ERRN signals high. In this case, when none of the HLX, HLY, HLZ hit line signals are asserted, the BN signal turns the P-channel MOSFET 234 fully off and the N-channel MOSFET 240 fully on, while the B signal turns the P-channel MOSFET 242 fully on and the N-channel MOSFET 248 fully off.

If only one of the HLX, HLY, HLZ hit line signals is asserted while the remaining hit line signals are deasserted when the RESOLVE signal is asserted, the asserted hit line signal activates a corresponding pull-down N-channel MOSFET at the output of the inverter 226 (BN) and a corresponding pull-up P-channel MOSFET at the output of the inverter 228 (B). The BN signal is correspondingly not pulled all the way high and the B signal is not pulled all the way low, affecting the states of the MOSFETs within the differential comparator 232. Nonetheless, the combined voltage increments of the B, BN signals caused by one pull-up and one pull-down device is less than the aforementioned maximum voltage differential of the B, BN signals, so that the BN signal remains at a higher voltage than the B signal. The differential comparator 232 correspondingly deasserts the N3 and ERRN signals high indicating no error has occurred.

If two or more of the HLX, HLY, HLZ hit line signals are asserted when the RESOLVE signal is asserted, two or more corresponding pull-down N-channel MOSFETs at the output of the inverter 226 (BN) and corresponding pull-up P-channel MOSFETs at the output of the inverter 228 (B) are asserted. Thus, two or more voltage increments counteract the inverters 226 and 228 and thus the BN, B signals. The combined voltage increments of the B and BN bit line signals caused by two or more pull-up and pull-down devices are greater than the aforementioned maximum voltage differential between the B, BN signals, so that the B signal is at a higher voltage than the BN signal. The differential comparator 232 correspondingly asserts the N3 and ERRN signals low indicating an error has occurred.

Figure 3:
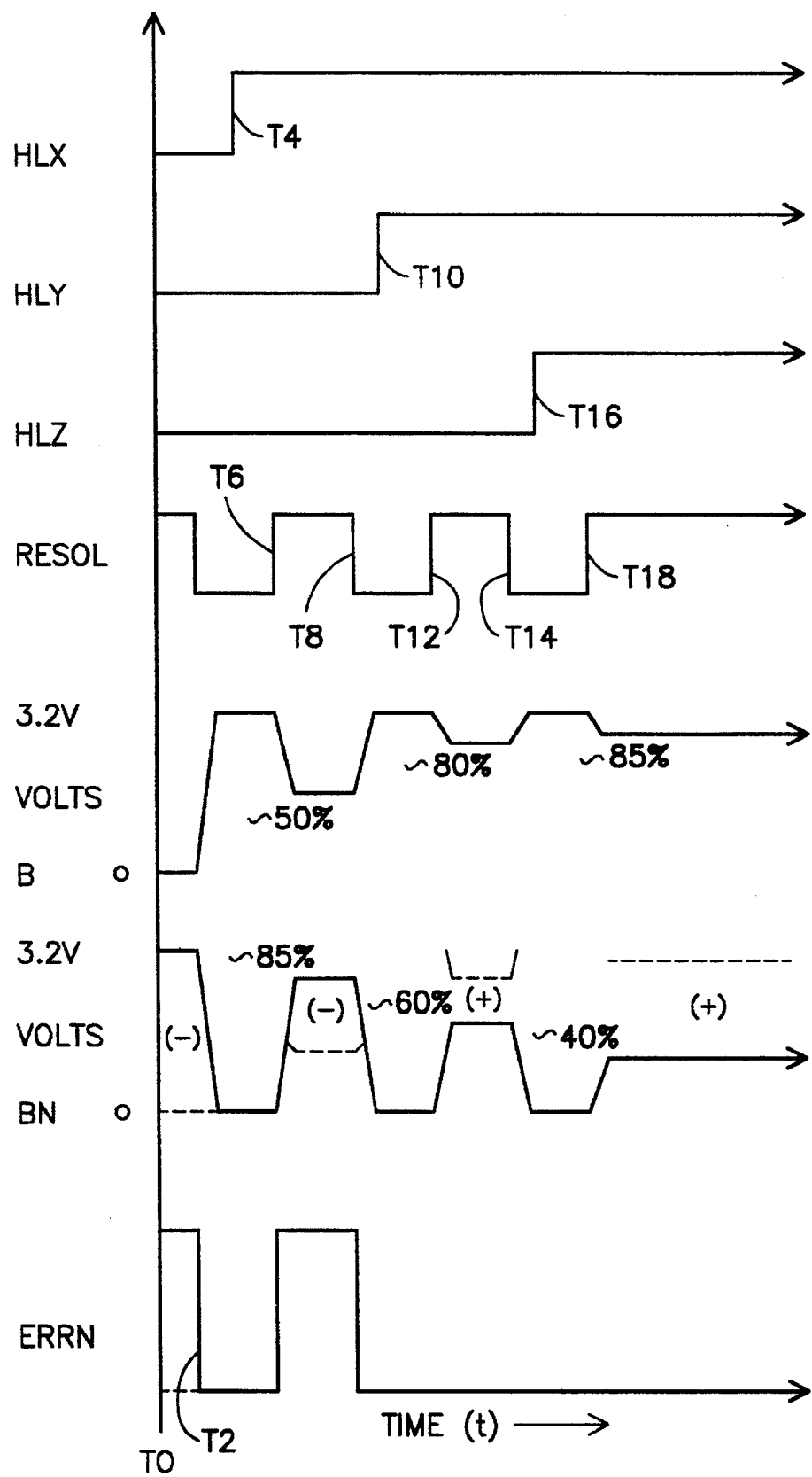
FIG. 3 is a timing diagram illustrating operation of the multiple match detection circuit of FIG. 2.

Operation of the multiple match detection circuit 200 is now described with reference to a timing diagram shown in FIG. 3. The HLX, HLY and HLZ hit line signals, the RESOLVE signal, the bit line signals B and BN and the ERRN signal are plotted along the Y axis versus time along the X axis in FIG. 3. The B signal is also superimposed on the BN signal as a dashed line, indicating the differential between the B and BN signals.

At a time T0, the HLX, HLY and HLZ hit line signals are all deasserted low, while the RESOLVE signal is asserted high. Since none of the N-channel MOSFETs 202, 204 and 206 and none of the P-channel MOSFETs 216, 218, 220 are turned on, the inverters 228 and 226 drive the B and BN signals to ground and to approximately 3.2V, respectively, at time T0. The differential comparator 232 thus asserts the ERRN signal high indicating a normal, non-error condition. At a time T2, the RESOLE signal is negated low, causing the B signal to be asserted fully high and the BN signal to be asserted fully low, where the ERRN signal is correspondingly asserted low. However, this is a non-error condition, since the ERRN signal is evaluated only when the RESOLVE signal is asserted high.

Subsequently at a time T4, the HLX hit line signal is asserted high, thereby activating the pull-down N-channel MOSFET 202 and the pull-up P-channel MOSFET 216. The RESOLVE signal is then asserted high at time T6, so that the B signal drops only to approximately half its voltage and the BN signal is asserted high to approximately 85% full voltage. The combined voltage differential caused by the MOSFETs 202, 216 is about 65% of the maximum differential of the B and BN signals. Since the voltage of the B signal is less than the voltage of the BN signal, the differential comparator 232 negates the ERRN signal high, indicating a non-error condition. The RESOLVE signal is subsequently negated at time T8.

The HLY hit line signal is asserted high at time T10 and the RESOLVE signal is correspondingly asserted high at time T12. The B signal drops only to approximately 80% of its maximum value and the BN signal rises to approximately 60–65% of its maximum value for a combined voltage increment of 120% of the B, BN signals maximum voltage differential. This causes a positive differential between the B and BN signals while the RESOLVE signal is asserted, so that the differential comparator 232 asserts (or keeps asserting) the ERRN signal low indicating an error condition. This is the correct operation since two of the hit line signals, HLX and HLY are asserted, indicating an error.

The RESOLVE signal is negated at time T14 and the HLZ signal is asserted at time T16 so that the HLX, HLY and HLZ hit line signals are all asserted at time T16. The RESOLVE signal is subsequently asserted at time T18, where the B signal only drops to approximately 85% of its full value and the BN signal only rises to approximately 40% of its maximum value. Again, the voltage differential between the B and BN signals is positive so that the differential comparator 232 continues to assert the ERRN signal, indicating an error condition. This is correct operation since more than one of the hit line signals are asserted high while RESOLVE is asserted high.

It is noted that a worst case condition occurs between times T12 and T14, where a positive differential of approximately 400 mV develops between the B and BN signals. A 400 mV differential is a significant amount of voltage and is easily detected by a standard differential comparator, such as the differential comparator 232 (FIG. 2). Thus, the differential comparator 232 need only detect relatively large voltage differentials (approximately 400 mV or greater) between the B, BN signals for correct operation.

The multiple match detection circuit 200 is very efficient and is relatively independent of variations in temperature, voltage and the manufacturing process. Due to the use of complementary bit lines and a differential comparator, such variations in voltage, temperature and processing have less affect on the desired operation. Essentially, voltage and temperature variations are canceled out between complementary devices so that the resulting effect is somewhat independent of such variations. Even manufacturing process variations are minimized using complementary devices, resulting in the correct operation over the spectrum of operating parameter variations.

Another advantage of the present invention is that it does not rely on a change in digital state before making a decision, which would be too slow if a plurality of hit line signals are being monitored. The greater the number of hit lines, the greater the amount of capacitance associated with the MOSFET devices, which would otherwise cause a significant increase in the time for switching a digital signal. In a multiple match detection circuit according to the present invention, a differential comparator measures a differential between two voltage signals rather than waiting for a digital change of state to occur. This provides a very fast switching mechanism relatively independent of the number of hit lines being monitored.

Although the system and method of the present invention has been described in connection with the preferred embodiment, it is not intended to be limited to the specific form set forth herein, but on the contrary, it is intended to cover such alternatives, modifications, and equivalents, as can be reasonably included within the spirit and scope of the invention as defined by the appended claims.

What is claimed is:

1. A detection system for detecting at least two of a plurality of input signals being asserted simultaneously, comprising:

first and second buffers for asserting a maximum voltage differential between two bit line signals;

an array of voltage modifying devices, each receiving a corresponding one of the input signals for decreasing said voltage differential between said bit line signals when a corresponding input signal is asserted, said array of voltage modifying devices reversing the polarity of said voltage differential when at least two of the input signals are asserted; and a differential comparator coupled to said bit line signals for detecting said voltage differential between said bit line signals and for asserting an error signal if the polarity is reversed.

2. The detection system of claim 1, wherein said array of voltage modifying devices comprises an array of N-channel devices and a corresponding array of P-channel devices for counteracting said first and second buffers, respectively.

3. The detection system of claim 2, further comprising:

a buffer receiving a timing signal for asserting a first bit line signal high;

an inverter receiving said timing signal for asserting a second bit line signal low;

said array of N-channel devices being coupled to said first bit line signal; and said array of P-channel devices being coupled to said second bit line signal.

4. A multiple match detection circuit for monitoring a plurality of hit line signals, comprising:

a first buffer for asserting a first bit line signal to a first predetermined voltage level;

a second buffer for asserting a second bit line signal to a second predetermined voltage level which is less than said first predetermined voltage level;

a plurality of pull-down devices, each receiving a corresponding one of the hit line signals for decreasing the voltage of said first bit line signal;

a plurality of pull-up devices, each receiving a corresponding one of the hit line signals for increasing the voltage of said second bit line signal; and a differential comparator for detecting a voltage differential between said first and second bit line signals and for asserting an error signal indicative thereof, wherein corresponding ones of said plurality of pull-up and pull-down devices reverse the polarity of said voltage differential between said first and second bit line signals when at least two of the hit line signals are asserted.

5. The multiple match detection circuit of claim 4, wherein said first predetermined voltage level is positive and said second predetermined voltage level is ground.

6. The multiple match detection circuit of claim 4, wherein said first buffer comprises two series inverter buffers and wherein said second buffer comprises an inverter buffer.

7. The multiple match detection circuit of claim 4, wherein said first and second buffers receive a timing signal for asserting said first and second bit line signals, respectively.

8. The multiple match detection circuit of claim 4, wherein said plurality of pull-down devices comprises an array of N-channel MOSFETs, each receiving a corresponding hit line signal at its gate and having its drain and source coupled between said first bit line signal and ground.

9. The multiple match detection circuit of claim 4, wherein said plurality of pull-up devices comprises:

an array of inverters, each receiving a corresponding hit line signal and asserting an inverted hit line signal; and an array of P-channel MOSFETs, each receiving a corresponding inverted hit line signal at its gate and having its drain and source coupled between a supply voltage and said second bit line signal.

10. The multiple match detection circuit of claim 4, wherein said differential comparator has a relatively wide common mode range.

11. The multiple match detection circuit of claim 4, wherein said differential comparator comprises:

a first P-channel MOSFET having its source coupled to a source voltage and its gate receiving said first bit line signal;

a second P-channel MOSFET having its source coupled to the drain of said first P-channel MOSFET and its gate and drain coupled to an intermediate node;

a first N-channel MOSFET having its drain and gate coupled to said intermediate node;

a second N-channel MOSFET having its drain coupled to the source of said first N-channel MOSFET and its gate receiving said first bit line signal;

a third P-channel MOSFET having its source coupled to said source voltage and its gate receiving said second bit line signal;

a fourth P-channel MOSFET having its source coupled to the drain of said third P-channel MOSFET, its gate coupled to said intermediate node and its drain coupled to an output node;

a third N-channel MOSFET having its drain coupled to said output node and its gate coupled to said intermediate node;

a fourth N-channel MOSFET having its drain coupled to the source of said third N-channel MOSFET, its gate receiving said second bit line signal and its source coupled to ground; and a fifth P-channel MOSFET receiving a timing signal at its gate, having its source coupled to said source voltage and its drain coupled to said intermediate node.

12. The multiple match detection circuit of claim 11, further comprising:

two series inverters having an input coupled to said output node of said differential comparator and an output for asserting said error signal.

13. The multiple match detection circuit of claim 4, wherein the difference between said first and second predetermined voltage levels defines a maximum voltage differential between said first and second bit line signals, wherein the combined voltage change of said first and second bit line signals caused by any one of the hit line signals being asserted is less than said maximum voltage differential, and wherein the combined voltage change of said first and second bit line signals caused by at least two of the hit line signals being asserted is greater than said maximum voltage differential.

14. A method of detecting at least two of a plurality of input signals asserted simultaneously for indicating an error condition, comprising the steps of:

asserting a maximum voltage differential between two bit line signals;

decreasing the voltage differential between the two bit line signals for each of the plurality of input signals asserted, wherein the polarity of the voltage differential is reversed if at least two input signals are asserted;

monitoring the voltage differential between the two bit line signals; and indicating an error if the polarity of the voltage differential is reversed.

15. The method of claim 14, wherein said asserting step comprises the steps of:

asserting a first bit line signal to a first voltage level; and asserting a second bit line signal to a second voltage level.

16. The method of claim 15, wherein the first voltage level is greater than the second voltage level, wherein said decreasing step comprises the steps of:

decreasing the voltage of the first bit line signal by an incremental amount; and increasing the voltage of the second bit line signal by an incremental amount.

17. The method of claim 16, wherein the combined incremental amount for any one input signal asserted is less than the maximum voltage differential, and wherein the combined incremental amount for two or more input signals asserted is greater than the maximum voltage differential.

* * * * *